(12) United States Patent
Erickson

(10) Patent No.: US 8,397,195 B2
(45) Date of Patent: Mar. 12, 2013

(54) METHOD AND SYSTEM FOR PACKET SWITCH BASED LOGIC REPLICATION

(75) Inventor: Robert Erickson, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 389 days.

(21) Appl. No.: 12/692,562

(22) Filed: Jan. 22, 2010

(65) Prior Publication Data

US 2011/0184717 A1 Jul. 28, 2011

(51) Int. Cl.
*G06F 17/50* (2006.01)
(52) U.S. Cl. .......................................... 716/110
(58) Field of Classification Search .................. 716/100, 716/110
See application file for complete search history.

(56) References Cited

U.S. PATENT DOCUMENTS

| | | | |
|---|---|---|---|
| 5,036,473 A | 7/1991 | Butts et al. | |
| 5,452,231 A | 9/1995 | Butts et al. | |
| 5,596,742 A | 1/1997 | Agarwal et al. | |
| 5,661,662 A | 8/1997 | Butts et al. | |
| 5,761,484 A | 6/1998 | Agarwal et al. | |
| 5,805,610 A | 9/1998 | Illes et al. | |
| 5,812,414 A | 9/1998 | Butts et al. | |
| 6,259,699 B1 | 7/2001 | Opalka et al. | |
| 6,581,191 B1 | 6/2003 | Schubert et al. | |
| 6,904,576 B2 | 6/2005 | Ng et al. | |
| 7,213,216 B2 | 5/2007 | Ng et al. | |
| 7,600,053 B2 | 10/2009 | Carlson et al. | |
| 8,001,307 B1 * | 8/2011 | Gole et al. | 710/240 |
| 2003/0076831 A1 * | 4/2003 | Van Doren et al. | 370/394 |
| 2004/0004966 A1 | 1/2004 | Foster et al. | |
| 2005/0193256 A1 | 9/2005 | Moyer | |
| 2006/0125517 A1 | 6/2006 | Van Wageningen et al. | |
| 2006/0248377 A1 | 11/2006 | Tezcan et al. | |
| 2006/0259834 A1 | 11/2006 | Ng et al. | |

(Continued)

OTHER PUBLICATIONS

PCTUS2011/022148, International Search Report and the Written Opinion, Date of Mailing Sep. 1, 2011, 10 pages.
PCT/US2011/022149, International Search Report and the Written Opinion, Date of Mailing Sep. 1, 2011, 11 pages.

(Continued)

*Primary Examiner* — Suchin Parihar
(74) *Attorney, Agent, or Firm* — Blakely, Sokoloff, Taylor & Zafman LLP; Judith A. Szepesi

(57) ABSTRACT

A method and system for compiling a representation of a source circuit including one or more source subchannels associated with portions of source logic driven by a plurality of clock domains are described. Each source subchannel may generate packets carrying signal data from one of the portions of the source logic. A representation of a destination circuit may be compiled to include one or more destination subchannels associated with portions of destination logic replicating the source logic. Each destination subchannel may forward the signal data via the packets to one of the portions of the destination logic. A switching logic may be configured to map the source subchannels to the destination subchannels as virtual channels to forward the packets from the source subchannels to the destination subchannels. A single queue may be configured to couple with the switching logic to record packets from the source subchannels into a packet stream for a delay period to distribute to the destination subchannels. The destination logic may emulate the source logic synchronized with the plurality of clock domains delayed by the delay period.

27 Claims, 10 Drawing Sheets

U.S. PATENT DOCUMENTS

| | | | |
|---|---|---|---|
| 2008/0191736 | A1 | 8/2008 | Redgrave et al. |
| 2008/0301601 | A1 | 12/2008 | Ng et al. |
| 2008/0313589 | A1 | 12/2008 | Maixner et al. |
| 2009/0274168 | A1 | 11/2009 | Glickman et al. |
| 2010/0191884 | A1* | 7/2010 | Holenstein et al. ........... 710/200 |
| 2011/0185341 | A1* | 7/2011 | Somakumar et al. ......... 717/110 |
| 2012/0137192 | A1 | 5/2012 | Goma et al. |

OTHER PUBLICATIONS

PCT/US2011/022148, International Preliminary Report on Patentability, Date of Mailing Aug. 2, 2012, 6 pages.

PCT/US2011/022149, International Preliminary Report on Patentability, Date of Mailing Aug. 2, 2012, 7 pages.

* cited by examiner

700

Compiling representation of a source circuit including one or more source subchannels associated with portions of source logic driven by a plurality of clock domains, each source subchannel to generate packets carrying signal data from one of the portions of the source logic 701

↓

Compiling representation of a destination circuit including one or more destination subchannels associated with portions of destination logic replicating the source logic, each destination subchannel to forward the signal data via the packets to one of the portions of the destination logic 703

↓

Configuring switching logic mapping the source subchannels to the destination subchannels as virtual channels to forward the packets from the source subchannels to the destination subchannels 705

↓

Configuring a single queue coupled to the switching logic to record packets from the source subchannels into a packet stream for a delay period to distribute to the destination subchannels for the destination logic to emulate the source logic synchronous with the plurality of clock domains with the delay period 707

↓

Stepping through a sequence of steps in the replicated portions of the destination logic for debugging an error according to the trace recorded when the error occurs in the source logic 709

Generating packets to carry signal data from a plurality of portions of source logic for a destination logic cloning the source logic, the packets including identifiers identifying virtual channels mapping the plurality of portions of the source logic to a plurality of portions of the destination logic 801

Storing the packets into a queue as a trace of the signal data for a period 803

Distributing the packets from the queue to the portions of the destination logic according to the virtual channels identified 805

Unpacking the signal data from the packets to update the portions of the destination logic for the destination logic to emulate the source logic with a delay period corresponding to the trace of signal data buffered in the queue 807

Fig. 8

METHOD AND SYSTEM FOR PACKET SWITCH BASED LOGIC REPLICATION

FIELD OF INVENTION

Embodiments of the invention relate to the field of debugging integrated circuits, and more specifically to debugging integrated circuits using packet switch based virtual channels to replicate logic.

BACKGROUND

Designing an integrated circuit (IC) or a system usually requires verification and/or debugging to ensure design correctness. One common practice may be based on hardware assisted verification (HAV) which provides visibility for a logic module by cloning the module and piping inputs to the module through a FIFO (First In First Out) delay buffer. U.S. Pat. No. 7,213,216 describes examples of such a practice. Simulation of test cases for the logic module can be performed on the cloned logic module using the buffered inputs. However, if a module contains multiple clocks (or in multiple clock domains), HAV may require all inputs to each clock domain to be buffered in a separate FIFO. As a result, additional hardware and complex software are required to synchronize simulation operations in each clock domain.

Furthermore, an FIFO implemented in an on-chip RAM (Random Access Memory) may be limited by the availability of unused memory space. To increase the amount of buffering in an FIFO, an off-chip memory, such as DDR2 (Double Data Rate 2) or SDRAM (Synchronous Dynamic RAM), may be employed. However, board real estate and/or pin limitations may prohibit implementing an FIFO using a single physical memory for each clock domain. Thus, multiple FIFOs' for different clock domains may be required to be built from a single physical memory.

Nevertheless, an off-chip memory may be limited by fixed data widths. In addition, separate address space for each FIFO may have severe bandwidth limitations caused by, for example, significant overhead in memory context switching.

Therefore, traditional data buffer for hardware assisted design verification does not provide an efficient and scalable solution. Furthermore, background information with respect to logic design or verification can be found in the following U.S. Pat. Nos. 5,036,473; 5,452,231; 5,596,742; 5,661,662; 5,761,484; 5,812,414; and 6,581,191.

SUMMARY OF THE DESCRIPTION

An embodiment of the present invention includes methods and apparatuses that compile a representation of a source circuit including one or more source subchannels associated with portions of source logic driven by a plurality of clock domains. Each source subchannel may generate packets carrying signal data from one of the portions of the source logic. A representation of a destination circuit may be compiled to include one or more destination subchannels associated with portions of destination logic replicating the source logic. Each destination subchannel may forward the signal data via the packets to one of the portions of the destination logic. A switching logic may be configured to map the source subchannels to the destination subchannels as virtual channels to forward the packets from the source subchannels to the destination subchannels. A single queue may be configured to couple with the switching logic to record packets of a plurality of clock domains from the source subchannels into a packet stream for a delay period to distribute to the destination subchannels. The destination logic may emulate the source logic synchronized with the plurality of clock domains delayed by the delay period.

In another aspect of the present invention, packets may be generated to carry signal data from a plurality of portions of source logic for a destination logic cloning portions of the source logic. The packets may include identifiers identifying virtual channels mapping the plurality of portions of the source logic to a plurality of portions of the destination logic. A queue may store the packets as a trace of the signal data for a period. The packets may be distributed from the queue to the portions of the destination logic according to the virtual channels identified. Signal data may be unpacked from the packets to update the portions of the destination logic for the destination logic to emulate the source logic with a delay for the period of the trace.

In yet another aspect of the invention, packets may be generated to represent signal data from a plurality of portions of source logic driven by a plurality of clock domains. Each portion may belong to one of the clock domains. The packets may be formatted according to a packet format including a header field and a payload field. The payload field may carry the signal data. The header field may carry identifiers identifying virtual channels mapping the plurality of portions of the source logic to a plurality of portions of destination logic cloning the source logic. Each packet may be stored in one of a plurality of queues corresponding to the plurality of portions of the source logic. The packets may be arbitrated from the plurality of queues interleaved into a packet stream synchronous with each of the clock domains for distribution to the destination (or target) logic according to the virtual channels.

In yet another aspect of the present invention, an integrated circuit may comprise a plurality of portions of source logic, operating under a plurality of different clock domains, and a plurality of portions of destination logic replicating the source logic. A storage in the integrated circuit may store virtual channels mapping the plurality of portions of the source logic to the plurality of portions of the destination logic. Concentrator logic in the integrated circuit may serialize packets carrying signal data from the plurality of portions of the source logic into a queue in the storage for a delay. Each packet may identify one of the virtual channels. Distributor logic in the integrated circuit may distribute the signal data from the packets retrieved from the queue to the portions of the destination logic according to the virtual channels subsequent to the delay.

In yet another aspect of the present invention, a plurality of portions of source logic may be selected from one or more ICs for replication. Packing logic may be inserted to the source logic to generate packets for representing signal data of the selected portions of the ICs. Each packet may include a source identifier identifying one selected portion. Unpacking logic may be inserted to destination logic replicating the selected portions of the source logic. Signal data may be extracted from received packets in the unpacking logic for the replicated portions. Each received packet may include a destination identifier identifying one of the replicated portions. Switching logic may be configured to map the destination identifiers to the source identifiers as virtual channels to forward the signal data from the selected portions to the replicated portions via delay logic recording a trace of the signal data over a delay period. A representation of the ICs may be displayed in display device. A hardware description language (HDL) code may be compiled to generate a technology independent RTL (register transfer level) netlists representing the ICs.

In yet another aspect of the present invention, a packet switch hub may concentrate data packets carrying signal data of different clock domains from a source circuit into a single packet stream in a single buffer, e.g. a FIFO, utilizing nearly full potential bandwidth of a memory (e.g. off-chip memory). The packets may be put in memory in approximately (within an arbiter error margin) the order they happen in real time for distribution to a destination circuit. The capability of using one single buffer may allow the packet switch hub to eliminate the complexity of synchronizing separate buffers corresponding to different clock domains. In other embodiments, the packet switch hub may provide the flexibility to route signals from chip to chip, capturing characterization data, and/or sourcing test vectors for system bring-up.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The invention is illustrated by way of example, and not by way of limitation, in the figures of the accompanying drawings in which like reference numerals refer to similar elements.

FIG. 7 is a flow diagram illustrating a process for logic emulation according to one embodiment of the present invention;

FIG. 8 is a flow diagram illustrating an embodiment of a process to forward packets via virtual channels;

DETAILED DESCRIPTION

Figure 1:
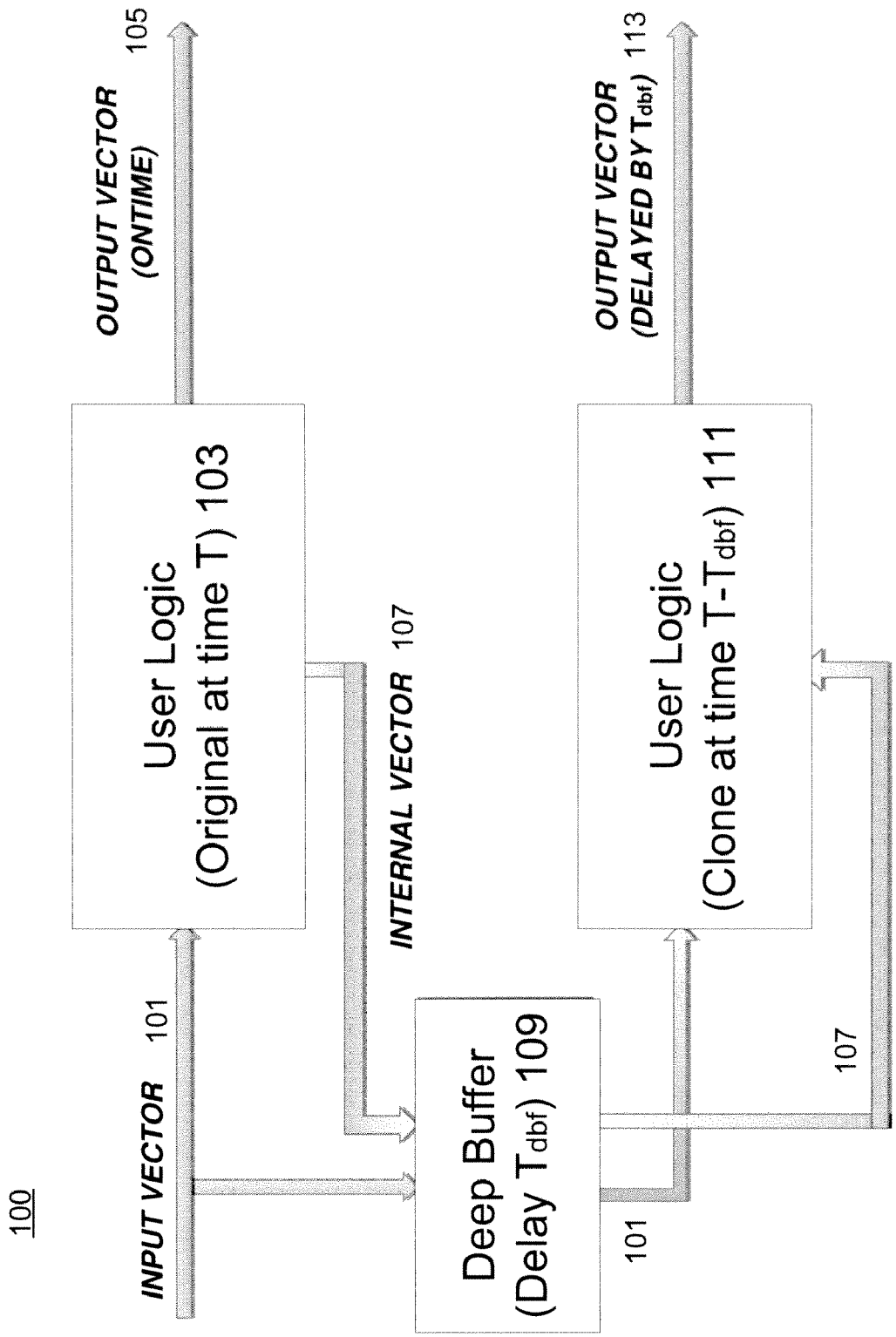
FIG. 1 illustrates one embodiment of logic emulation of the present invention.

Embodiments of a system and method for replicating logic using virtual channels are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In one embodiment, a packet switch hub may be programmed to concentrate signal data from an original circuit (or source logic) as a single stream of packets fed into a FIFO buffer in an external (e.g. off-chip) memory. The stream of packets may be retrieved from the FIFO and forwarded to, for example, a clone circuit replicating the original circuit. In some embodiments, the clone circuit may not need to replicate the whole original circuit. Instead, the clone circuit may replicate particular portions of the original circuit, for example, operating under a certain clock domains. An example of a system which uses a clone circuit, that replicates at least a portion of an original circuit, is described in U.S. Pat. No. 7,213,216 which patent is incorporated herein by reference.

In one embodiment, a packet switch hub may include arbiter logic and/or hub control logic. Arbiter logic may concentrate into an FIFO multiple packets which arrive at switching logic at about the same time (e.g. within certain clock cycles). Hub control logic may retrieve packets in sequence from the FIFO for distribution at a rate substantially equal to the incoming rate of the packets. The single FIFO (operating on a single clock) may buffer packets from multiple clock domains in the source or original circuit instead of using multiple small FIFOs' for each clock domain in the source or original circuit. This single FIFO can provide the buffered packets to a destination or clone circuit that includes multiple clock domains that correspond to (and are synchronized to) the multiple clock domains in the source or original circuit. In some embodiments, the FIFO may utilize more than 80% of bandwidth of an off-chip memory.

A packet switch hub may define where to send signal data from one part of an original or source circuit to another part of a destination circuit via a virtual channel. Typically, a virtual channel may correspond to groups of signal data forwarded together from a source circuit to be used in a replicated destination circuit sometime later. Signal data from different clock domains may belong to separate virtual channels. The packet switch hub maintains synchronization of the data signal between two or more clock domains on both the source and destination sides. In this manner, the cloned logic in a destination device can receive the data signals in a manner synchronized with how the original logic receives the data signals.

Signal data may be packed into packets corresponding to data paths or channels. For example, packets of 16 words with 64 bit size may carry signal data from a thousand signals as a data path. A packet may include a channel identifier for a hub (or packet switch hub) to determine where to forward the packet. In one embodiment, a hub may store channel descriptors or virtual channel definitions in a ROM indexed (or addressed) according to channel identifiers to specify, for example, a source of a packet, a destination of a packet, a number of words (carrying signal data) in a packet, a packet type, and/or other description information etc.

Typically, a channel descriptor may pair a source and a destination for packets. A hub may rely on channel descriptors to determine where to forward each packet received in a packet stream. Optionally, a hub may perform certain operations, such as memory read/write, for a packet based on a packet type.

In one embodiment, a source circuit and a destination circuit may be based on two separate programmable devices, such as FPGA ((Field Programmable Logic Array) devices coupled with a hub in between with switching logic. In some embodiments, source and destination circuits may be based on one single FPGA device externally coupled to a hub with packets going out from the FPGA device to the hub and coming back from the hub to the FPGA device via high speed TDM (Time Domain Multiplexer).

In one embodiment, each chip in a source circuit, such as an FPGA chip, may be synthesized with source concentrator logic to collect packets from different data paths or channels in the chip and send the packets across an interface to a packet switch hub. Each chip in a destination circuit, such as an FPGA chip, may be synthesized with destination distributor logic to receive packets via an interface coupled with the packet switch hub and distribute the packets to different data paths in the chip.

In one embodiment, a packet switch hub may reveal traces of signal data from certain portions of a circuit in different clock domains for design verification. For example, a designer may configure a circuit to select one thousand signals to sample over a million cycles as a stream of packets recorded in a hub, e.g. via an off-chip FIFO. An analysis may be performed on signal data reproduced from the stream of packets read from the hub to extract, for example, characterization data such as power consumption (e.g. based on signal switching rate), memory cache performance, or other aspects of a design etc.

In another embodiment, a packet switch hub may be coupled to one circuit. The packet switch hub may provide a stream of packets carrying signal data from an off-chip memory (e.g. via an FIFO) to feed test vectors to certain portions of the circuit, e.g. to make sure that a specific sequence of inputs and produces a known sequence outputs. In other embodiments, a packet switch hub may route signal data between separate circuits (e.g. without cloning relationships), such as among FPGA devices. The hub may be configured to provide required connections among different devices without a need to change physical cable connectors.

In one embodiment, packets may be written into a memory (e.g. an off-chip FIFO operating under control of a single clock) in the order they arrive. When a sufficient number of packets have been written to the memory, reading of the memory may start at a rate substantially equal the rate they arrive. The packets may subsequently be distributed to various destinations based on channel descriptors. In some embodiment, assertions of first packets arriving at the destinations may be synchronized using a common timer or by validating that all destinations for a particular clock have received data. After synchronization of the first packets at the destinations, subsequent packets may remain synchronized by using a copy of the original circuit's clocks.

FIG. 1 illustrates one embodiment of logic emulation of the present invention. Logic 100 may be configured for a system to debug user logic 103. In one embodiment, logic 100 may include circuits implemented in one or more chips, such as ASIC (Application Specific Integrated Circuit) chips, FPGA chips, PLD (Programmable Logic Device) chips, or other devices. User logic 103 may be driven by multiple clock domains based on synchronous and/or asynchronous clocks. In one embodiment, input vector 101 may provide sequences of inputs to user logic 103 to perform logic operations driven by multiple clock domains to produce output vector 105.

User logic 111 may be a clone of user logic 103 to replicate logic operations, such as for debugging or verification purpose. User logic 111 as a clone may be modified from the original user logic 103, for example, by logically separating clock domains in the clone. In one embodiment, internal vector 107 may include signal data from selected portions of user logic 103. Each selected portion of user logic 103 may include one or more registers representing one or more states of user logic 103 within one clock domain. Input vector 101 and internal vector 107 may carry signal data in user logic 103 driven by multiple clock domains.

In one embodiment, configuration of logic 100 may enable user logic 111 to perform logic operations emulating user logic 103 delayed by a delay period $T_{dbf}$. Input vector 101 and internal vector 107 may feed user logic 111 from deep buffer 109 substantially synchronous (e.g. within one or more clock cycles) with user logic 103 delayed by the delay period $T_{dbf}$. Consequently, output vector 113 from user logic 111 may be delayed by the delay period $T_{dbf}$ compared with output vector 105 from user logic 103.

In one embodiment, logic 100 may include deep buffer 109 to record input vector 101 and internal vector 107 as a trace of signals for a delay period $T_{dbf}$. Deep buffer 109 may be based on a fixed width queue storing packets including signal data from input vector 101 and internal vector 107. Capacity or depth of deep buffer 109 can depend on the number of signals represented by input vector 101 and internal vector 107 for user logic 103. Additionally, a capacity requirement for deep buffer 109 may depend on the delay period $T_{dbf}$ designated and the clock domains associated with input vector 101 and internal vector 107. In one embodiment, deep buffer 109 may be based on an off-chip memory to provide scalability for accommodating a variety of capacity requirements in designing and/or debugging user logic 103.

In some embodiments, logic 100 may include trigger logic and control logic to allow single-stepping through user logic 111 based on the trace of signals stored in deep buffer 109 to debug user logic 103. Typically, the trigger logic may detect occurrences of trigger conditions on selected signals from user logic 103. The control logic may control, for example, clocks in different clock domains driving both user logic 103 and user logic 111. On the detection of trigger conditions, in one embodiment, the control logic may stop the clocks to temporarily freeze logic operations on user logic 103 and/or cause the execution of user logic 111 to pause. Thus, deep buffer 109 can provide signal trace during the previous $T_{dbf}$ period to allow a user to step through user logic 111 which is delayed by $T_{dbf}$ to inspect a history of user logic 103.

Figure 2:
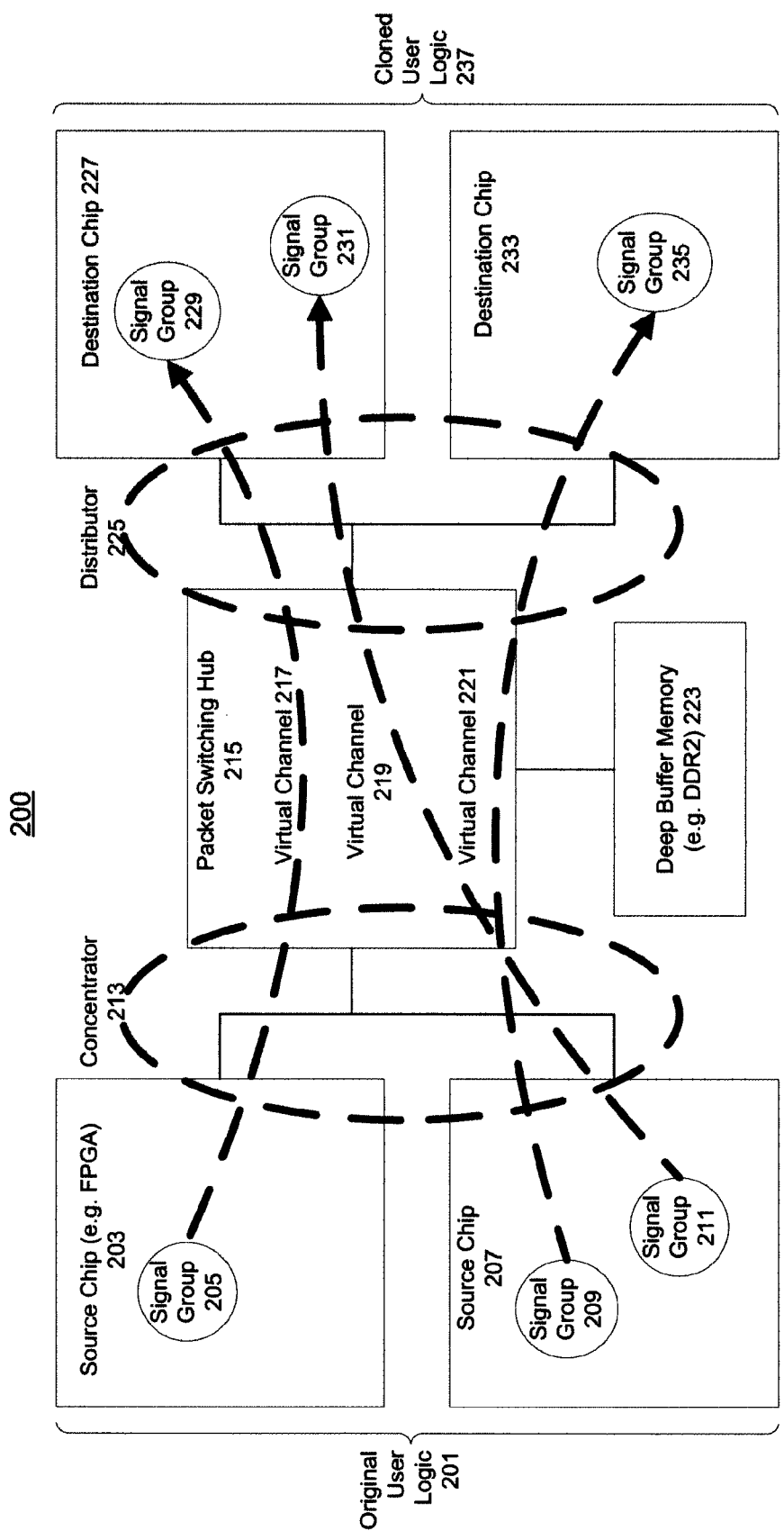
FIG. 2 is a block diagram illustrating an exemplary system for switching packets for logic emulation or logic design testing.

FIG. 2 is a block diagram illustrating an exemplary system for switching packets for logic emulation or logic design testing. In one embodiment, logic 100 of FIG. 1 may be based on one or more components of system 200, for example, providing deep buffer memory 223 for deep buffer 109 of FIG. 1. System 200 may include original user logic 201 configured in source chips 203, 207 and user logic 237 configured in destination chips 227, 233 to clone user logic 201. Chips 203, 207, 227, 223 may be programmable devices, such as FPGA devices. Signals groups 205, 209, 211 may be selected from user logic 201 to update corresponding signal groups 229, 231, 235 for user logic 237 to replicate user logic 201. Each signal group may include one or more signals representing a portion of corresponding user logic. In one embodiment, user logic 201 may be driven by a plurality of clocks (synchronous and/or asynchronous) in separate clock domains. Signals within one signal group may belong to one single clock domain.

Packet switch hub 215 may define virtual channels to forward data from source signal groups in original user logic 201 to destination signal groups in cloned user logic 237 while recording the data as signal traces sharing common memory space. For example, virtual channel 217 may allow signal data from source signal group 205 to update destination signal group 229 after the signal data staying in deep buffer memory 223 as signal traces for a delay period. In one embodiment, signal traces for separate virtual channels 217, 219 and 221 in packet switch hub 215 in different clock domains may be synchronized with a common delay period to allow cloned user logic 237 to emulate original user logic 201 delayed by the common delay period.

Packet switch hub 215 may include a storage, such as a ROM (Read Only Memory) or a RAM, storing channel definitions defining virtual channels via identifiers identifying source signal groups and destination signal groups. The identifiers can include a source identifier identifying a source signal group, such as signal group 205, and a destination identifier identifying a destination signal group, such as signal group 229. Packet switch hub 215 can forward data received from a source signal group, such as signal group 205, across a virtual channel, such as virtual channel 217, to a destination signal group, such as signal group 229, by delivering the signal data to interface addresses for the destination signal group identified in the virtual channel.

In one embodiment, data from original user logic 201 may be carried across virtual channels, such as virtual channels 217, 219, 221, in packets to clone logic 237 via packet switch hub 215. Each packet may be packed according to a known (or preconfigured) format including an identifier identifying a virtual channel and a payload carrying data from a source signal group. Packet switch hub 215 may identify a virtual channel according to identifiers extracted from packets received.

In one embodiment, packet switch hub 215 can push packets received from user logic 201 for multiple virtual channels 215, 219, 221 into a single queue in deep buffer memory 223 to record signal traces for user logic 201. As each packet is popped out from the queue, the packet switch hub 215 may forward the packet to a destination signal group as defined in a virtual channel. In one embodiment, the packet switch hub 215 may update a packet retrieved from the queue with a destination identifier identifying the destination signal group according to the virtual channel.

Concentrator logic 213 may pack data from original user logic 201 as packets to carry the signal data with an identifier identifying a virtual channel to the cloned user logic 237. In one embodiment, concentrator logic 213 can collect (or serialize) packets for multiple virtual channels into a packet stream according to a temporal order synchronous with original user logic 201. A temporal order may indicate a difference in time within an ordered relationship. Concentrator logic 213 may push packets associated with separate clock domains for user logic 201 in a linear order within the queue. In one embodiment, concentrator logic 213 can maintain the linear order temporally synchronized with the separate clock domains.

Distributor logic 225 may unpack signal data from packets arriving at cloned user logic 237 for a virtual channel, such as virtual channel 217, to update a signal group, such as signal group 229, identified in the virtual channel. In one embodiment, distributor 225 may retrieve packets from a queue in deep buffer memory 223 to distribute signal data from original user logic 201 to cloned user logic 237 at a rate enabling cloned user logic 237 to synchronize with original user logic 201 with a delay for recording signal traces in the queue. Packets from original user logic 210 may be pushed into the queue at an equal rate as the packets are popped from the queue to cloned user logic 237 synchronized with one or more clock domains driving both original user logic 201 and cloned user logic 237. A virtual channel for a destination signal group, e.g. virtual channel 217 for signal group 229, may be associated with a destination chip device, e.g. destination chip 227. Distributor 225 may identify an interface address to a destination chip device to deliver a packet based on a virtual channel associated with the packet.

Figure 3:
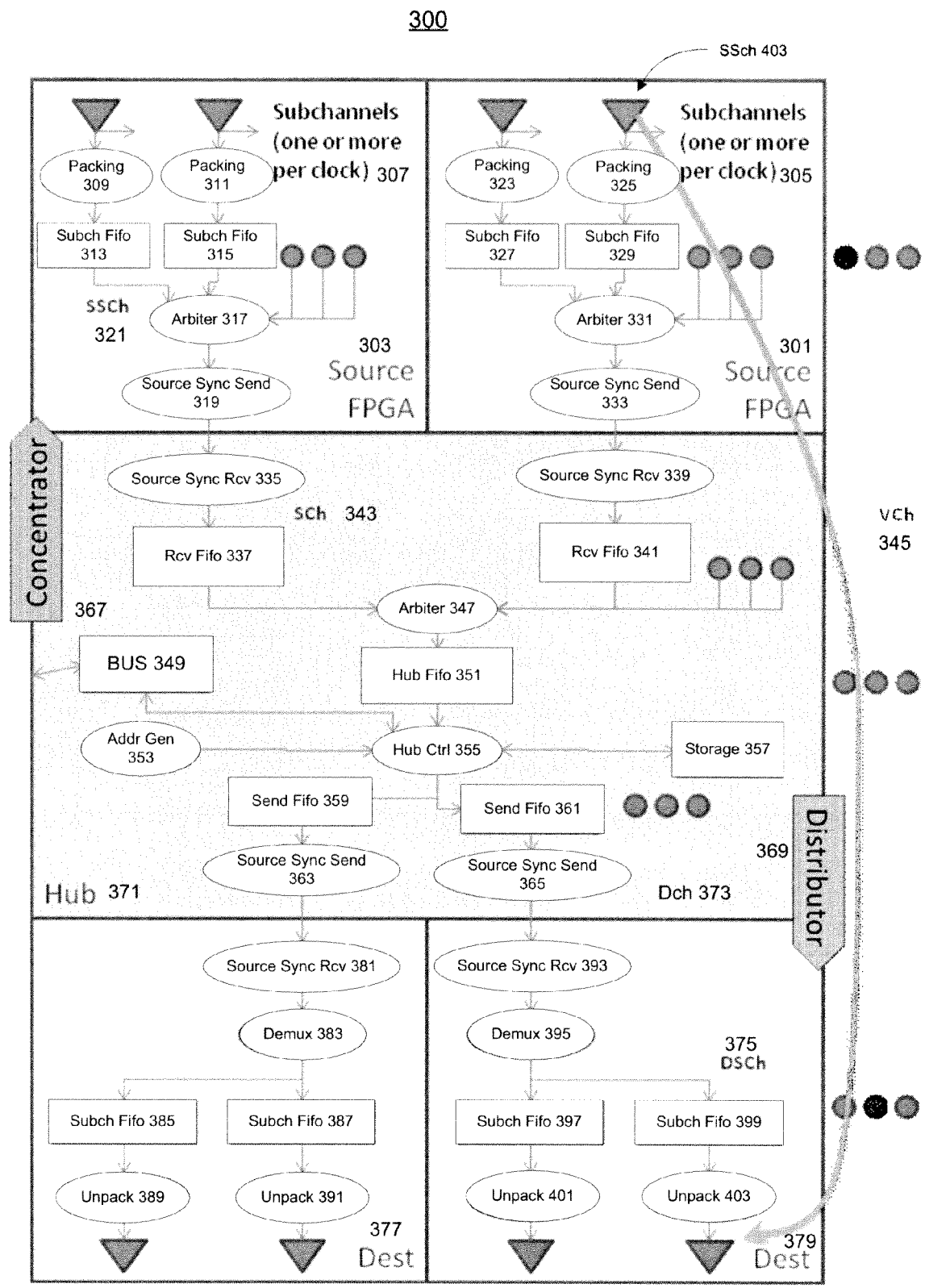
FIG. 3 is a block diagram illustrating an exemplary architecture for establishing virtual channels between source logic and destination logic.

FIG. 3 is a block diagram illustrating an exemplary architecture for establishing virtual channels between source logic and destination logic. Exemplary architecture 300 may include one or more components to support system 200 of FIG. 2. In one embodiment, source chips (e.g. FPGA chips) 301, 303 may include source logic having signal groups identified as one or more source subchannels, such as subchannels 305, 307. Similarly, destination chips 377, 379 may include destination (or sink) logic, e.g. cloning the source logic, having signal groups identified as one or more destination subchannels, such as subchannel 375. The number of source subchannels may be the same with or different from the number of destination subchannels. Each subchannel may be driven by one clock domain (or clock) for the corresponding logic, e.g. source logic or destination logic.

In one embodiment, source and destination chips may be based on separate programmable logic devices each in separate integrated circuits. Alternatively, source and destination chips may share a single logic device implemented within one integrated circuit. In one embodiment, hub 371 may be a packet switch hub coupled with source and destination chips 301, 303, 377, 379 to forward packets carrying signal data from source subchannels to destination subchannels as virtual channels, such as vch 345 for source subchannel ssch 403 and destination subchannel dsch 375. Hub 371 may be based on the same or separate logic devices for source and/or destination chips 301,303,377, 379.

In one embodiment, source chips 301, 303 may be configured with source concentrator logic to establish virtual channels for source subchannels 305, 307. Source concentrator logic may include, for example, packing logic, such as packing 309, 311, 323, 325, for each subchannel to pack signal data from a subchannel as a sequence of packets according a preset packet format. The packing logic may be configured with an identifier identifying a corresponding virtual channel. The packing logic may form a packet containing the identifier together with signal data.

Each packing logic, according to one embodiment, may generate a sequence of packets carrying signal data from a corresponding source subchannel in a clock domain. Source concentrator logic may include a source channel queue (e.g. based on FIFO data order), such as subch fifo 313,315, 327, 329, for each source subchannel to store packets generated from the corresponding packing logic. For example, packing logic 309 may generate packets into a corresponding source channel queue subch fifo 313. Source channel queues may be allocated to serialize packets from separate subchannels synchronized with separate clock domains driving these subchannels.

In one embodiment, each source chip, e.g. source 303, may be coupled with a packet switch hub, e.g. hub 371, via an interface, such as time divisional multiplexing interface, to forward packets. Source concentrator logic may include send logic, such as source sync send 319, 333, in each source chip to send a stream of packets from a source chip via an interface to a hub. Send logic in a source chip may synchronize with a clock domain of a hub for sending packets. Typically, the clock domain of a hub, e.g. hub 371 may be of a higher frequency than the clock domains driving source logic in source chips to allow the hub to collect packets from source subchannels and preserve temporal orders of signal data carried in the packets according to the clock domains driving the source logic.

In one embodiment, source concentrator logic may include arbiter logic, e.g. arbiter 317, in each source chip to arbitrate packets into a sequence (or serialize the packets) from a plurality of source channel queues, e.g. subch fifo 313, 315, within the source chip for send logic, e.g. source sync send 319, to forward to a hub, e.g. hub 371. The arbiter logic may be configured to maintain an order among packets or allow the packets to be synchronized with each respective source subchannel when interleaved with each other in sequence. In one embodiment, arbiter logic may select packets alternatively from multiple source channel queues in a fair share manner (e.g. based on fair share algorithm). Other selection schemes may apply.

Hub 371 may be a packet switch hub similar to, for example, packet switch hub 215 of FIG. 2, configured with concentrator logic 367 for collecting packets from each source chip, e.g. source 301, 303, into a single packet stream while maintaining an order among the packets in the packet stream synchronized with multiple clock domains driving the source chips. In one embodiment, concentrator logic may include a source channel for each source chip, such as sch 343 for source 303. A source channel may include receive logic, e.g. source sync rcv 335, 339, collecting packets into a receive queue, e.g. rcv fifo 337, 341, from an interface coupled to a source chip. A receive queue may store a packet stream with packets serialized from multiple subchannels in a source chip to allow a hub to merge packet streams from multiple source chips into one single queue while preserving temporal orders among the packets synchronized with multiple clock domains driving the multiple source chips.

In one embodiment, concentrator logic may include memory arbiter logic, e.g. arbiter 347, to arbitrate packets received from multiple source chips 301, 303 into a single packet stream while maintaining an order among packets within the packet stream synchronized with multiple clock domains driving source chips 301, 303. For example, arbiter 347 may employ a round-robin scheme to decide which packet to retrieve next from multiple receive queues, e.g. rcv fifo 337, 341, each corresponding to one source chip. Other retrieving schemes may apply. Memory arbiter logic can verify whether packets arrive out of order to ensure packets which arrive about the same time from different subchannels to be forwarded to destination subchannels about the same time (e.g. within a known error margin).

In one embodiment, hub 317 may include a hub queue, e.g. hub fifo 351, managed by memory control logic within one processing context (e.g. without a need for context switching). Arbiter 347 may merge streams of packets arriving from source channel queues 337, 341 . . . into hub queue 351 as a stream of packets. According to one embodiment, a hub queue may be based on an off-chip memory, such as deep buffer memory 223 of FIG. 2, to scale its capacity for accommodating a large number of packets from multiple source subchannels driven by multiple clock domains in different source chips. A hub queue may be associated with a configurable depth indicating a size or capacity for the hub queue allocated in memory.

Packets may be pushed into and popped from a hub queue at a substantially equal rate, e.g. within an error margin according to the clock domain driving the hub queue and the queue's memory read and write burst size. Thus, a hub queue may act as a delay for each packet in a packet stream passing through the hub queue. The length of the delay may depend on, for example, the clock domain driving the hub queue and/or the depth (or size) configured for the hub queue. Typically, hub queue 351 may be driven by a clock domain at a higher frequency than the multiple clock domains driving subchannels 307, 305 in the source logic to allow a packet stream passing through the queue carrying signal data from subchannels 307, 305 synchronized with the multiple clock domains.

Hub 371 may include hub control logic, e.g. hub ctrl 355, which can identify a virtual channel for each packet retrieved (or popped) from hub queue 351 to forward the packet to a destination according to a virtual channel. Hub control 355 may read packets from hub queue 351 at a substantially equal rate as arbiter 347 writes the packets into hub queue 351. In one embodiment, hub control logic may be configured to start reading or retrieving packets from a hub queue when the hub queue is full or sufficiently full. A hub queue may be sufficiently full if a stream of packets stored in the hub queue occupies memory space exceeding a certain level (e.g. based on a configurable percentage) of the total memory space allocated for the hub queue.

In one embodiment, hub control 355 may retrieve definition of a virtual channel stored in storage 357 according to a channel identifier retrieved from a packet. Hub control logic may be configured with a packet format specifying a channel identifier for each packet. Hub control logic may look up a destination address to forward a packet based on a channel identifier. In one embodiment, storage 357 may be a ROM storing definitions of virtual channels indexed by channel identifiers.

According to one embodiment, a virtual channel may specify a destination for a packet according to a destination chip identifier and a destination subchannel identifier for identifying a destination chip, e.g. destination 377, 379, and a destination subchannel, e.g. dsch 375 in the destination chip. Hub control 355 may generate an address for a destination chip via address generator logic, e.g. addr gen 353, using the destination chip identifier. In one embodiment, hub control 355 may update a packet with the destination subchannel identifier defined in a virtual channel to allow a destination chip to distribute the updated packet to the destination subchannel.

Hub 371 may be configured with distributor logic 369 for distributing a stream of packets collected from source chips, e.g. source 301, 303. Distributor logic may include hub control logic, such as hub control 355 to determine where to forward a packet. In one embodiment, distributor logic may include a destination channel for each destination chip, such as dch 373 for destination chip 379. A destination channel may include a send queue, such as send fifo 359, 361, to store packets distributed from hub control logic for a destination chip. Each destination channel may include send logic, e.g. source sync send 363, 365, to send packets from a send queue over to a destination chip in sequence via an interface coupled to the destination chip. In one embodiment, address generator logic 353 may provide hub control 355 with an address to a send queue, e.g. send fifo 361, for a destination chip, e.g. destination chip 379, based on a destination chip identifier.

A destination chip, e.g. dest 377, 379, may include destination distributor logic to receive packets carrying signal data destined to destination subchannels in the destination chip. Source distributor logic may include receive logic, e.g. source sync rcv 381, 393, to receive packets sent over an interface with hub 371. In one embodiment, receive logic may be synchronized with hub 371, e.g. sharing a clock domain, to receive packets from hub 371. Receive logic may include de-multiplexer logic, e.g. demux 383, 395, to distribute each received packet to a destination subchannel.

De-multiplexer logic may extract a destination subchannel identifier from a received packet to forward the packet to a destination channel queue, e.g. subch fifo 385, 387, 397, 399. Each destination subchannel may be associated with a separate destination channel queue, e.g. subch fifo 399 for dsch 375. A destination channel queue may store packets to allow synchronous distribution of signal data carried in the packets to a destination subchannel according to a clock domain for the destination subchannel.

Destination distributor logic may include unpacking logic, such unpack 389, 391, 401, 403, for each destination subchannel to unpack data from packets retrieved from a destination channel queue to update the destination subchannel. Unpacking logic may be configured with a packet format for decoding signal data out of packets received from a corresponding destination channel. In one embodiment, unpacking logic and an associated destination subchannel, e.g. unpacked 403 for dsch 375, may belong to the same clock domain.

In another embodiment, hub 371 may include bus logic, e.g. bus 349, to interface with, for example, an external data processing system, such as a PC (personal computer) or a designer workstation. Instructions or data may be communicated as packets between an external system and hub 371 for control, command, configuration, monitoring, debugging, or other purposes. In one embodiment, storage 357 may store definitions specifying packet formats for performing logic operations in response to packets received from external systems. For example, definitions in storage 357 may specify memory reads, memory writes, clock controls (stop/start), and/or other logic operations according an identifier included in a packet.

In some embodiments, hub 371 may synchronize assertions of first packets received at multiple destination chips 377, 379 to ensure synchronization between source logic and destination logic, e.g. with a delay. Source logic and destination logic (e.g. cloning the source logic) may be driven by common clock domains, e.g. based on the same clocks, to ensure synchronization of subsequence packets among destination chips if the first packets are synchronized.

In one embodiment, hub 371 and/or each destination chip may be configured with counter logic. Once a condition is detected (e.g. hub queue 351 is full or sufficiently full) to start sending packets from hub queue 351, hub 371 may simultaneously initiate counting a common amount for counter logic in each destination chip, for example, via side signals. Hub 371 may start counting the same common amount at the same time before sending the first packet. In another embodiment, hub 371 may arbitrate synchronization among destination chips by exchanging handshaking signals with each individual destination chip.

Figure 4:
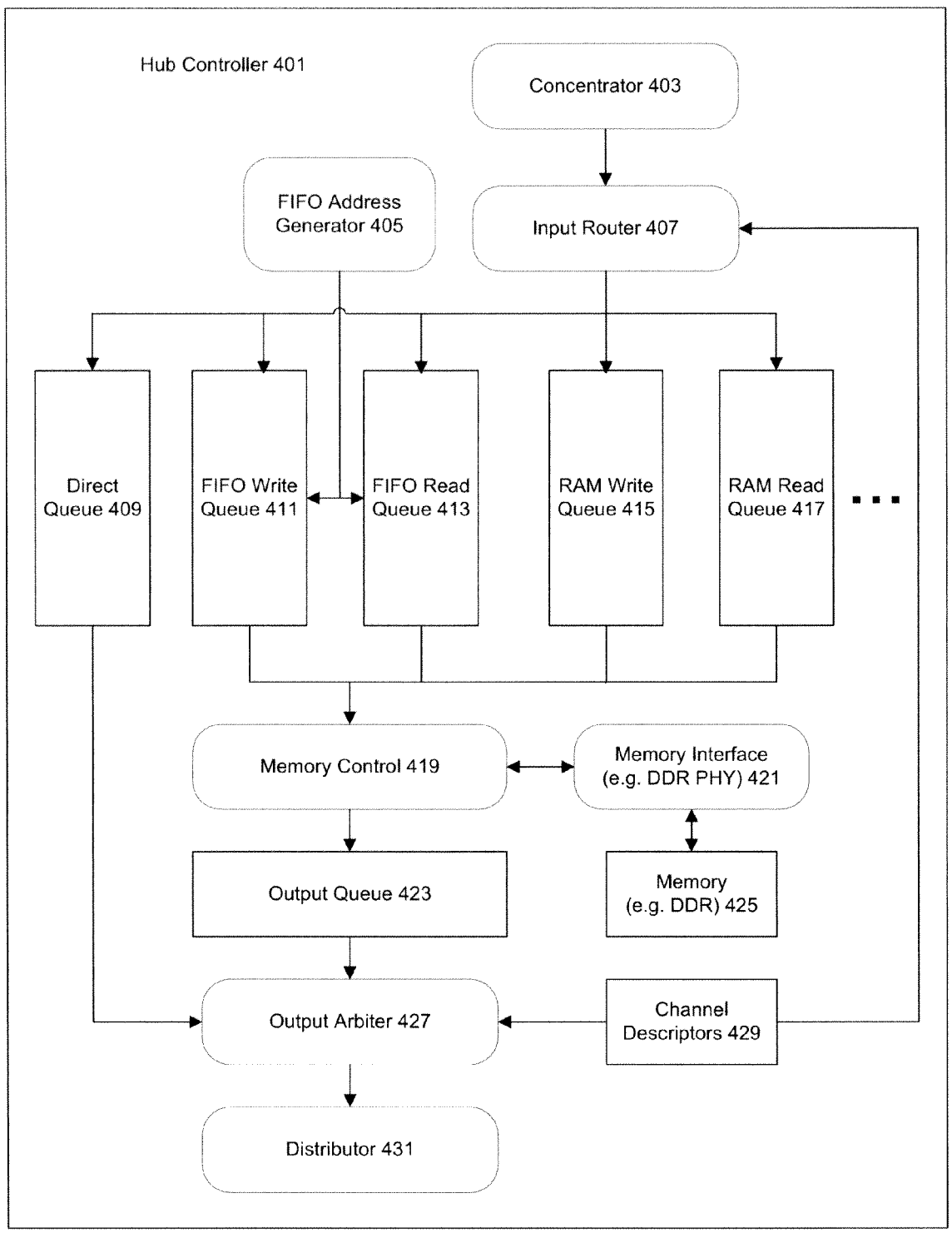
FIG. 4 is a block diagram illustrating an exemplary architecture for hub control logic to switch packets.

FIG. 4 is a block diagram illustrating an exemplary architecture for hub control logic to switch packets. For example, hub control logic 355 of FIG. 3 may be based on a portion of architecture 400. In one embodiment, architecture 400 may be configured with hub concentrator logic, e.g. concentrator 403, to receive packets in sequence, such as from a hub queue 351 or bus 349 of FIG. 3, for input router logic, e.g. input router 407, to route to an appropriate queue. Input router logic may decode a received packet to make packet routing decisions based on channel definitions stored in a ROM, such as in storage 357 of FIG. 3. Channel descriptors 429 may include a copy of channel definitions for input router 407.

In one embodiment, input router logic can identify a type for a received packet to determine which queue to forward the received packet based on a channel definition identified by an identifier decoded from the received packet. For example, a packet of type "direct" may be routed to direct queue 409 associated with a high priority to lower possible latency when forwarding the packet to a destination from a hub.

In some embodiments, input router logic can determine which queue to forward a received packet according to a mode and/or memory space associated with the received packet based on channel definitions. For example, packets of mode "read" or "write" may be sorted into separate memory queues, such as FIFO write queue 411, fifo read queue 413, RAM write queue 415, RAM write queue 417, . . . depending on the mode and/or associated memory space. Write queues, such as queues 411, 415, may contain both address and data. Read queues, such as queues 413, 417, may include addresses without data. Separating queues for different memory spaces may allow interleaving memory accesses among multiple memory banks. In one embodiment, FIFO queues, such as queues 411, 413, may include memory access addresses (e.g. read or write) guaranteed to be in different banks for interleaving the memory accesses in maximal bursts.

Memory control logic, e.g. memory control 419, may arbitrate among various input queues, such as queues 411,413, 415 417 . . . to sequence memory access requests from the input queues to a memory, such as DDR memory 425 via memory interface 421. In one embodiment, memory control logic may keep track of memory read requests and format output packets for the memory read requests and insert the output packets into an output queue, such as output queue 423. In one embodiment, architecture 400 may include output arbiter logic, e.g. output arbiter 427, to choose packets between direct queue 409 for direct channels and output queue 423 for memory channels according to channel descriptors 429 to forward the packets to hub distributor logic, e.g. distributor 431, for packet distribution, e.g. via distributor logic 369 of FIG. 3.

Figure 5:
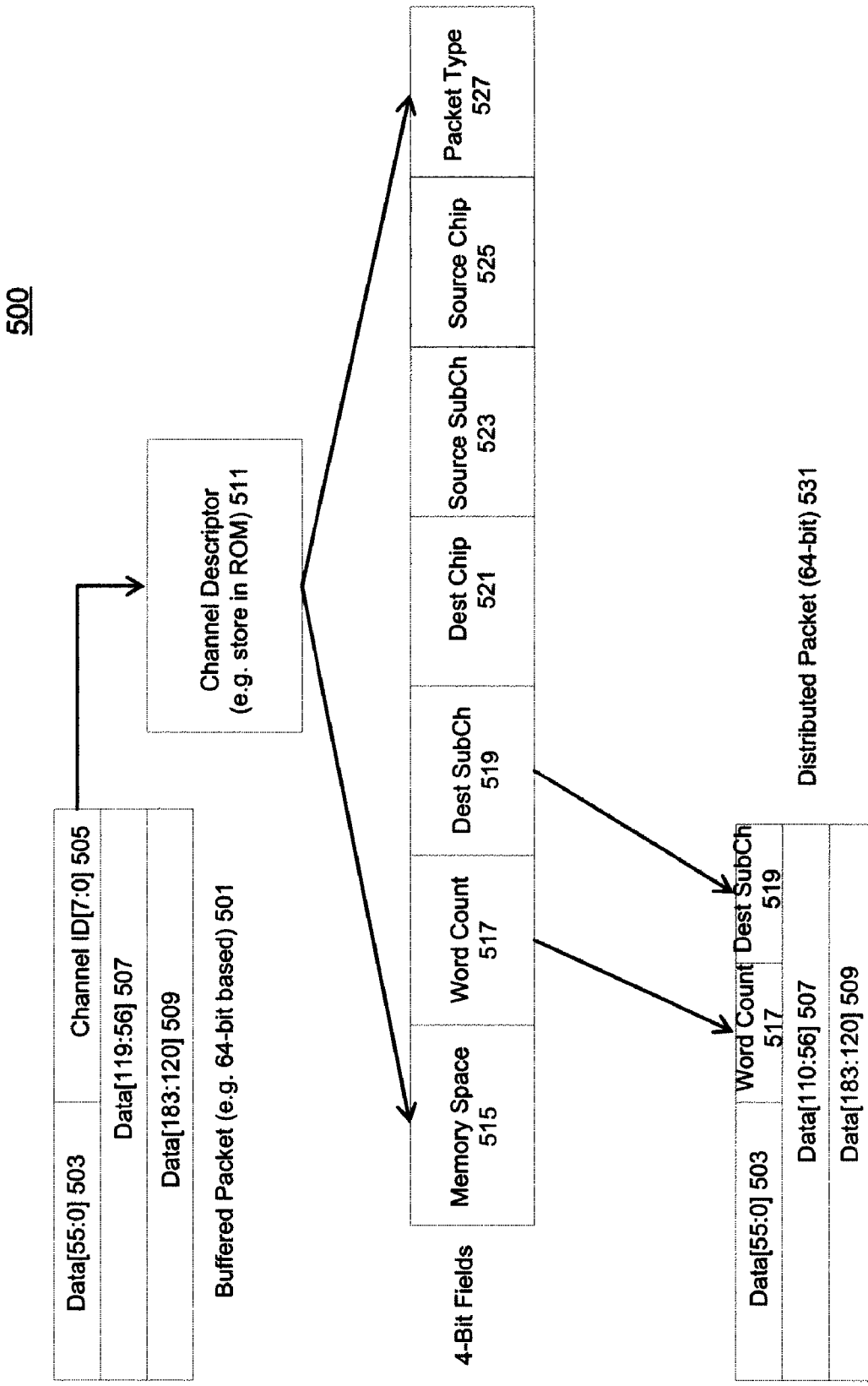
FIG. 5 is a schematic diagram illustrating an example of packet formats to carry data for a channel of logic.

FIG. 5 is a schematic diagram illustrating an example of packet formats to carry signal data for a virtual channel. For example, virtual channels 217, 219, 221 of FIG. 2 may be based on packets generated according to format 500. In one embodiment, a packet may be an atomic unit of communication between one portion of source logic and another portion of destination logic. A packet may include varied number of words, for example, up to 16 words. Each word in a packet may have a common width, e.g., 32 bits, 64 bits, etc. Typically, channels defined in a packet switch hub, such as hub 215 in FIG. 2, may be based on packets having a common word width.

Buffered packet 501 may represent an example of 64-bit based packet including three 64-bit words. For example, buffered packet 501 may begin with a header word including a header, e.g. 8-bit header for channel ID 505, with signal data carried in the rest of the header word and two data words 503, 507,509. In one embodiment, packing logic 325 may generate packets to be buffered in hub queue 351 in FIG. 3 based on buffered packet 501. A packet may be specified with different number of words based on different bit sizes, for example, depending on the size of a channel (or number of signals from a portion of logic) and/or configurations of packet switch logic.

In one embodiment, channel ID 505 may correspond to a channel descriptor 511, such as a channel definition or specification stored in a ROM in storage 357 of FIG. 3. Channel descriptors or channel definitions in a ROM may include multiple channel descriptors indexed by channel identifiers. In some embodiments, channel descriptors may be stored in a small ROM in a packet switch hub, such as storage 357 of FIG. 3. Configurations of source and destination chips, such as source chips 301, 303 and destination chips 377, 379 of FIG. 3, may depend on only a portion of channel descriptors in a packet switch hub, such as hub 371 of FIG. 3.

Channel descriptor 511 may include multiple fields, e.g. each having 4-bit in width, storing identifiers to identify a variety of aspects of a channel. An aspect of a channel may be related to a memory space, for example, dedicated to a packed based on a clock domain, as identified in a memory space field, such as memory space 515. Another aspect may be related to a number of words that follow a header in a packet, as indicated in a work count field, such as word count 517. Another aspect may be related to a destination subchannel in destination logic, as identified in a destination subchannel field, such as dest subch 519. Another aspect may be related to a physical destination chip as identified in a destination chip identifier field, such as dest chip 521. Another aspect may be related to a source subchannel in source logic, as identified in a source subchannel field, such as source subch 523. Another aspect may be related to a source chip as identified in a source chip identifier field, such as source chip 525. Yet another aspect may be related to a packet type as identified in a packet type identifier field, such as packet type 527. Although exemplary identifiers in 4-bit fields are illustrated, a channel descriptor may include fields of other applicable bit widths, and may include additional information fields. Also, the format of the channel descriptor may differ depending on the channel packet type.

In one embodiment, packet type 527 may include a code to be interpreted by a packet switch hub, such as hub control logic 355 in hub 371 of FIG. 3, as in the following table:

| Label | Code | Packet Format | Description |
|---|---|---|---|
| NOP | 0 | Switch | Ignore this packet (e.g. source channels or subchannels may need to send something even if corresponding source channel queues are empty). |
| Direct | 1 | Switch | Direct connection from source to destination with best achievable latency |
| TRDB | 2 | Switch | Total Recall Deep Buffering: the packet may be stored in the TRDB address space of a memory (e.g. DDR buffer) for a number of clock cycles corresponding to the depth of a buffer and then transferred to the destination |
| IDDB | 3 | Switch | Identify Deep Buffering: the packet may be stored in a circular buffer in the specified address space of a (e.g. DDR) memory, which can be read back through a bus. |
| WR | 4 | Write | Write: the packet may be written to the specified address in the channel's address space. |
| RDOP | 5 | Read | Read Operation: the data at the specified address may be formatted into a RDDATA packet |
| RDDATA | 6 | Switch | Read Data: after data is read from memory, this packet may forward the data to the destination |
| DBSTOP | 7 | Broadcast | Deep Buffering Stop: stop tracing and stop the clones at the next opportunity |

Distributed packet 531 may represent an example of 64-bit based packet reformatted from buffered packet 501, e.g. after a delay passing a queue in a packet switch hub, such as hub queue 531 of FIG. 3. In one embodiment, distributed packet 531 may carry the same data 503, 507, 509 as in buffer packet 501 with the header reformatted to carry a word count and an identifier identifying a destination subchannel copied from fields in a corresponding channel descriptor, such as word count 517 and dest subch 519. As a result, buffered packets and distributed packets may share the same packet signal data, but carry separate header information.

Figure 6:
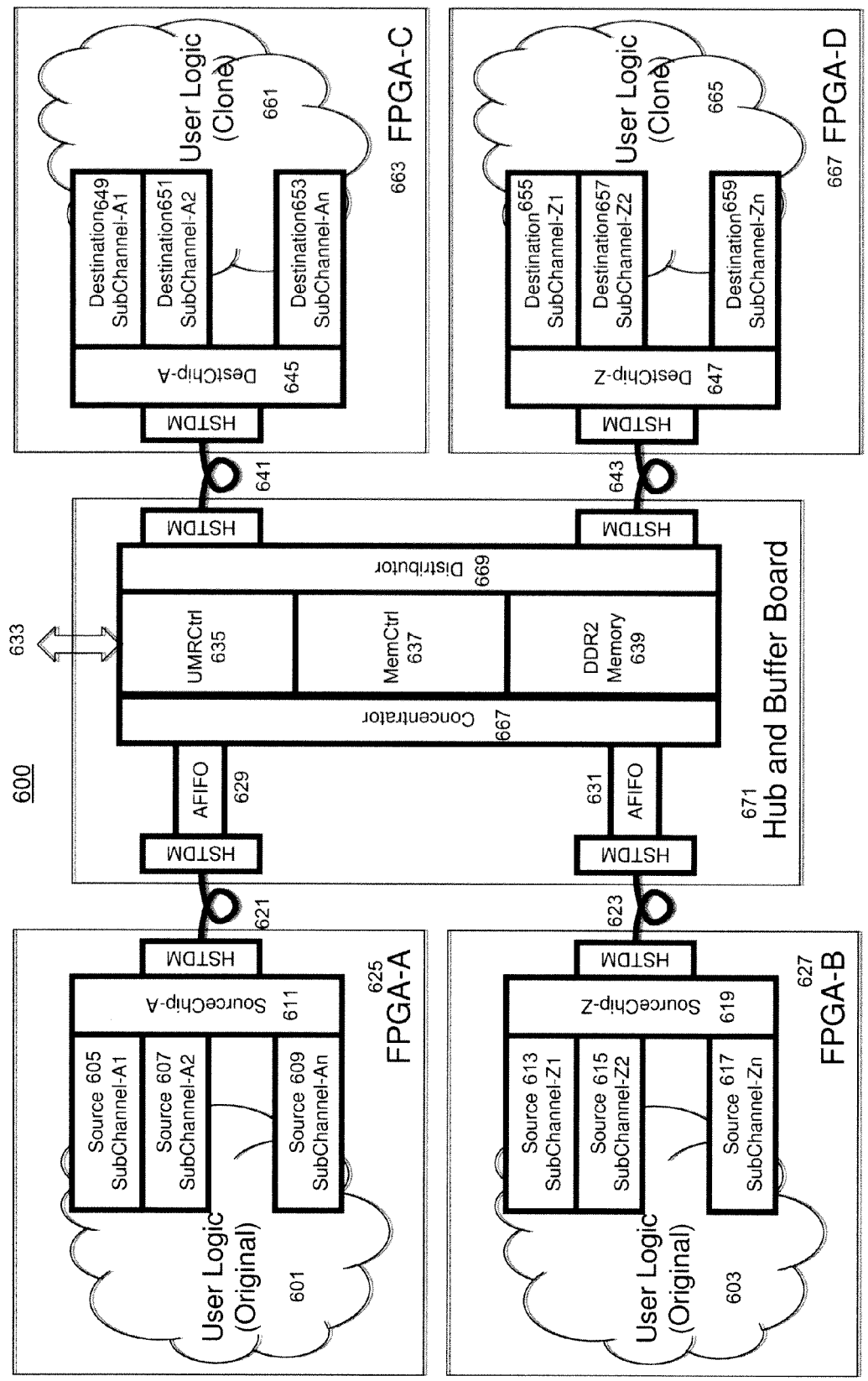
FIG. 6 is a block diagram illustrating an exemplary configuration for a packet switch hub.

FIG. 6 is a block diagram illustrating an exemplary configuration for a packet switch hub. For example, architecture 300 of FIG. 3 may be based on one or more components illustrated in configuration 600. In one embodiment, source FPGA chips FPGA-A 625, FPGA-B 627. FPGA chips may be configured with (source) user logic 601, 603. Destination FPGA chips FPGA-C 663, FPGA-D 667 may be configured with (destination) user logic 661, 667 cloning user logic 601, 603. Hub and buffer board 671 may be a circuit board configured with virtual channels to forward signal data as packets through a single buffer from source chips to destination chips for user logic 661, 665 to clone user logic 601, 603 in a synchronized manner with a delay based on the single buffer.

In one embodiment, board 671 may be coupled with FPGA chips via HSTDM (high speed time domain multiplexer) interfaces 621, 623, 641, 643. An interface to a source chip may correspond to a source channel, such as source sch 343 of FIG. 3. In one embodiment, an interface may include an asynchronous FIFO, such as AFIFO 629, 631, which may perform logic operations similar to rcv fifo 337, 341 of FIG. 3. Each source subchannel, such as source subchannels A1 605, A2 607 . . . An 609, Z1 613, Z2 615 . . . Zn 617 may forward signal data from a portion (or subchannel) of original user logic 601, 603 to a corresponding portion in clone user logic 661, 665 via a destination subchannel, such as destination subchannels A1 649, A2 651 . . . An 653, Z1 655, Z2 657 . . . Zn 659.

Source chips A 625, B 627 may include channel logic Sourcechip A 611, Z 619 to serialize packets carrying signal data from source subchannels in each chip to an interface to hub and buffer board 671, e.g. based on similar logic as source channel logic including arbiter 317 of FIG. 3. Correspondingly, destchip A 645, 647 in destination chips A 645, Z 647 may distribute a packet stream from hub and buffer board 671 to each individual destination subchannel in the chip, e.g. based on similar logic as destination channel logic including demux 395 of FIG. 3. Hub and buffer board 671 may include concentrator 667 based on arbiter logic, such as arbiter 347 of FIG. 3, to further serialize packet streams from each chip corresponding to a source channel into a single delay buffer in memory 639. Additionally, distributor 669 in hub and buffer board 617 may distribute packets from the single delay buffer to each destination chip corresponding to a destination channel, e.g. based on similar logic as hub control 355 of FIG. 3.

In one embodiment, hub and buffer board 671 may include virtual channel definitions stored in memory 639 mapping each source subchannel, such as A1 605 . . . Zn 617 to a destination subchannel, such as A1 649 . . . Zn 659. MemCtrl 637 may be a memory control managing packets carrying signal data in different address spaces for multiple virtual channels within one single memory context without context switch. Bus control, e.g. UMRCtrl 635, may control bus 633 coupled to a data processing system, such as a PC or workstation.

FIG. 7 is a flow diagram illustrating a process for logic emulation according to one embodiment of the present invention. Exemplary process 700 may be performed by a processing logic that may comprise hardware (circuitry, dedicated logic, etc.), software (such as is run on a dedicated machine), or a combination of both. For example, a software tool may be configured to automatically synthesize or create a design to emulate logic for debugging according to process 700.

In one embodiment, at block 701, the processing logic of process 700 can compile a representation of a source circuit including source logic for debugging. Representation of a circuit may be based on a hardware description language, such as VHDL (Very High Speed Integrated Circuit (VHSIC) Hardware Description Language), Verilog or other HDL (Hardware Description Language) etc. The processing logic of process 700 may generate a netlist, such as a RTL (Register Transfer Level) netlist or other low level logic representation code for mapping into one or more devices, such as source chips 203, 207 of FIG. 2, to implement the source circuit.

A source circuit may include one or more source subchannels, e.g. ssch 321 of FIG. 3, to select portions of the source logic for debugging, such as subchannels 307 of FIG. 3. Source logic in the source circuit may be driven by a plurality of clock domains or clocks. In one embodiment, each selected portion of the source logic can be driven by only one of the clock domains. A source subchannel may be configured with a preconfigured packet format and an identifier associated with a corresponding portion of source logic. In one embodiment, a source subchannel, e.g. may pack signal data from a corresponding portion of source logic with the configured identifier for identifying a portion of destination logic to forward the signal data synchronized with a corresponding clock domain driving the associated portion of the source logic.

In one embodiment, at block 703, the processing logic of process 700 can compile a representation of a destination circuit including destination logic replicating the source logic. The processing logic of process 700 may synthesize the destination circuit in one or more devices, such as destination chips 227, 233 of FIG. 2. In some embodiments, one or more chips may be shared by both source and destination circuits. The destination circuit may include one or more destination subchannels, e.g. dsch 375 of FIG. 3, to select portions of the destination logic for emulating source logic. Both destination logic and source logic may be driven by common or similar clock domains for logic emulation. A destination subchannel may be configured with a packet format to receive packets carrying signal data from source logic to update an associated portion of destination logic.

In one embodiment, at block 705, the processing logic of process 700 may configure switching logic with virtual channels, such as virtual channels, such as virtual channels 217, 219, 221 of FIG. 2, mapping source subchannels to destination subchannels to forward signal data from portions of source logic to corresponding portions of destination logic. The switching logic and the source and/or destination circuits may be based on separate devices. In some embodiments, the switching logic may be based on the same devices implementing the source circuit and/or destination circuit. The processing logic of process 700 can define or store virtual channels into the switch logic, such as in storage 357 of FIG. 3, including identifiers identifying source and destination subchannels.

At block 707, the processing logic of process 700 may configure a single queue, such as deep buffer memory 223 of FIG. 2, coupled to switching logic to record packets from the source subchannels into a packet stream for a delay period to distribute to the destination subchannels. The single queue may enable the destination logic to emulate the source logic synchronized with a plurality of clock domains driving the source logic with a delay for packets to pass through the single queue.

The processing logic of process 700 may specify a depth (or size) of a single queue to accommodate packets from different portions of source logic in separate clock domains as a single packet stream to distribute to corresponding portions of destination logic for emulating the source logic. The processing logic of process 700 may ensure the single queue has sufficient capacity to record an amount of signal data suitable for debugging the source logic.

In one embodiment, at block 709, the processing logic of process 700 may step through a sequence of logic operations in replicated portions of destination logic for debugging an error that occurred in source logic. For example, the source logic may include trigger logic detecting the occurrence of targeted conditions for debugging purposes. The trigger logic may cause the source logic and destination logic to pause execution, such as via a control to clocks driving the source and destination logic. The processing logic of process 700 may step through logic operations in the destination logic according to a trace of signal data from the source logic left in a single queue recording a packet stream corresponding to a delay period.

FIG. 8 is a flow diagram illustrating an embodiment of a process to forward packets via virtual channels. Exemplary process 800 may be performed by a processing logic that may comprise hardware (circuitry, dedicated logic, etc.), software (such as is run on a dedicated machine), or a combination of both. For example, the processing logic of process 800 may be based on architecture 300 of FIG. 3. At block 801, in one embodiment, the processing logic of process 800 may generate packets, such as in packing 309, 311 of FIG. 3, carrying signal data from portions of source logic according to a packet format (e.g. preconfigured). Each packet may include an identifier for a virtual channel, such as virtual channel 217 of FIG. 2, for updating a portion of destination logic cloning the source logic.

At block 803, in one embodiment, the processing logic of process 800 can store or collect packets from multiple portions of source logic driven by different clock domains into a queue, such as hub fifo 351 of FIG. 3, as a packet stream corresponding to a trace of signal data from the source logic for a period. At block 805, the processing logic of process 800 can distribute the stream of packets from the queue in sequence, such as in hub ctrl 355 of FIG. 3, to portions of the destination logic according to virtual channels identified in each packet. According to one embodiment, at block 807, the processing logic of process 800 may decode or unpack signal data from the packets arriving from the queue to update portions of the destination logic, such as in unpack 389, 391 of FIG. 3, for the destination logic to emulate the source logic with a delay period corresponding to a trace of the signal data buffered in the queue.

Figure 9:
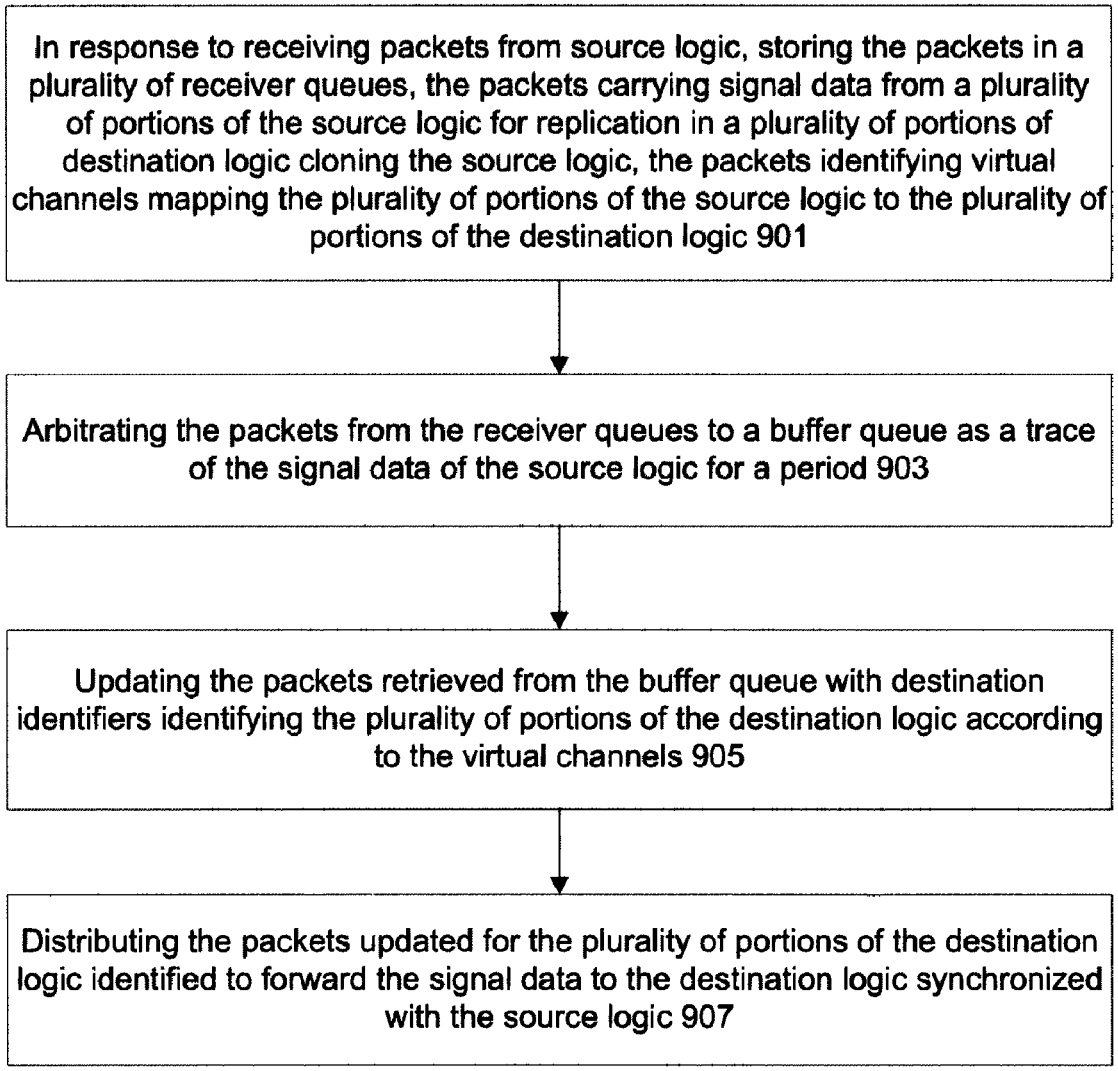
FIG. 9 is a flow diagram illustrating an embodiment of a process to concentrate and distribute packets.

FIG. 9 is a flow diagram illustrating an embodiment of a process to concentrate and distribute packets. Exemplary process 900 may be performed by a processing logic that may comprise hardware (circuitry, dedicated logic, etc.), software (such as is run on a dedicated machine), or a combination of both. For example, the processing logic of process 900 may be based on hub 371 of FIG. 3. In one embodiment, at block 901, in response to receiving packets from portions of source logic, the processing logic of process 900 can store the packets in a plurality of receiver queues, such as rcv fifo 337, 341 of FIG. 3. Each receiver queue may correspond to one or more portions of the source logic implemented in one device, such as source fpga 303 of FIG. 3. The packets may carry signal data from the source logic for destination logic to clone the source logic. Each packet can include an identifier for one of virtual channels, such as vch 345 defined in storage 357 of FIG. 3, mapping portions of the source logic to corresponding portions of the destination logic.

At block 903, in one embodiment, the processing logic of process 900 can arbitrate (or serialize) packets, such as in arbiter 347 of FIG. 3, stored in a plurality of receiver queues into a buffer queue, such as hub fifo 351 of FIG. 3, as a trace of signal data of source logic for a period (or delay). In one embodiment, at block 905, the processing logic of process 900 can updating the packets from the buffer queue with destination identifiers identifying portions of the destination logic, such as dsch 375 of FIG. 3, according to virtual channels identified in the packets. Subsequently at block 907, the processing logic of process 900 can distribute the packets to portions of the destination logic identified in the packets, such as in hub ctrl 355 of FIG. 3, according to virtual channels. The processing logic of process 900 can forward signal data in the packets to the destination logic synchronized with the source logic driven by a plurality of clock domains.

Figure 10:
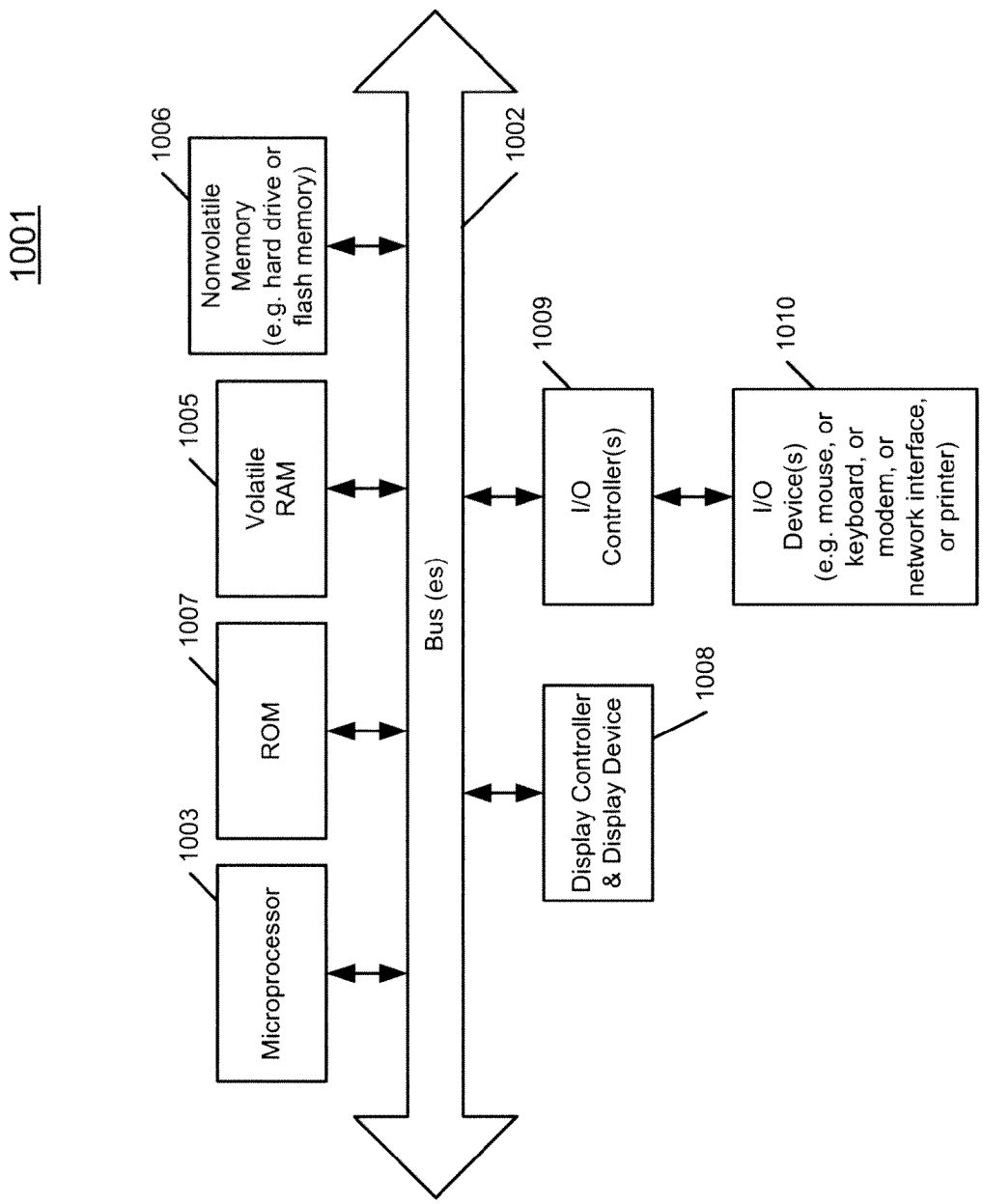
FIG. 10 is a block diagram illustrating a suitable computing environment in which certain aspects of the invention can be practiced.

FIG. 10 shows an example of a data processing system which may be used with one embodiment of the present invention. Note that while FIG. 10 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 10 may, for example, be an Apple Macintosh computer or a SUN SPARC workstation.

As shown in FIG. 10, the computer system 1001, which is a form of a data processing system, includes a bus 1002 which is coupled to a microprocessor 1003 and a ROM 1007 and volatile RAM 1005 and a non-volatile memory 1006. The microprocessor 1003, which may be a G3 or G4 microprocessor from Motorola, Inc. or IBM is coupled to cache memory 1004 as shown in the example of FIG. 10. The bus 1002 interconnects these various components together and also interconnects these components 1003, 1007, 1005, and 1006 to a display controller and display device 1008 and to peripheral devices such as input/output (I/O) devices which may be mice, keyboards, modems, network interfaces, printers, scanners, video cameras and other devices which are well known in the art. Typically, the input/output devices 1010 are coupled to the system through input/output controllers 1009. The volatile RAM 1005 is typically implemented as dynamic RAM (DRAM) which requires power continually in order to refresh or maintain the data in the memory. The non-volatile memory 1006 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 10 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 1002 may include one or more buses connected to each other through various bridges, controllers and/or adapters as is well known in the art. In one embodiment the I/O controller 1009 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory which is a machine or computer readable storage medium, such as ROM 1007, volatile RAM 1005, non-volatile memory 1006, or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 1003.

A machine readable storage medium can be used to store software and data which when executed by a data processing system causes the system to perform various methods of the present invention. This executable software and data may be stored in various places including for example ROM 1007, volatile RAM 1005, or non-volatile memory 1006 as shown in FIG. 10. Portions of this software and/or data may be stored in any one of these storage devices.

Thus, a machine readable storage medium includes any mechanism stores information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for logic design testing, the method comprising:
    generating packets by a processor to carry signal data from a plurality of portions of source logic for a destination logic cloning the source logic, the packets including identifiers identifying virtual channels mapping the plurality of portions of the source logic to a plurality of portions of the destination logic;
    storing the packets into a queue of the signal data for a period, the queue implemented in a cache;
    distributing the packets from the queue to the portions of the destination logic according to the virtual channels identified; and
    unpacking the signal data from the packets to update the portions of the destination logic for the destination logic to emulate the source logic with a delay for the period.

2. The method of claim 1, wherein the source logic is driven by a plurality of clock domains and wherein each portion belongs to one of the domains.

3. The method of claim 1, wherein the queue is in a switching logic coupled with the source logic via one or more interfaces, wherein the plurality of portions of source logic are associated with a plurality of source channel queues, and wherein storing the packets comprises:
    temporarily storing each packet in one of the plurality of source channel queues; and
    sending packets from at least one of the source channel queues to the switching logic via one of the interfaces.

4. The method of claim 3, wherein the source logic is partitioned into one or more devices, and wherein each device includes one of the interfaces.

5. The method of claim 3, further comprising:
arbitrating the packets from the at least one of the source channel queues into a sequence for sharing the one of the interfaces synchronized with the source logic.

6. The method of claim 5, wherein the switching logic is driven by a switching clock domain, the method further comprising:
synchronizing with the switching clock domain for the sending of the packets via the interfaces.

7. The method of claim 3, wherein the switching logic includes one or more receiver queues corresponding to the one or more interfaces to allow the packets to arrive concurrently among the interfaces, further comprising:
arbitrating the packets from the receiver queues in sequence into the queue synchronized with the source logic.

8. The method of claim 1, wherein the switching logic includes a storage storing a plurality of channel definitions for the virtual channels indexed by the identifiers, wherein the distribution comprises:
retrieving the packets from the queue in sequence;
decoding the identifiers from the packets retrieved for the channel definitions.

9. The method of claim 8, wherein the plurality of channel definitions include destination identifiers for the plurality of portions of the destination logic, the method further comprising:
updating the packets with the destination identifiers in place of the identifiers.

10. The method of claim 8, wherein the plurality of channel definitions identify one or more sender queues separately coupled to the destination logic, the method further comprising:
temporarily storing each packet in one of the sender queues; and
sending the packets from the sender queues in parallel to the destination logic synchronized with the source logic.

11. The method of claim 10, wherein the destination logic is partitioned into one or more devices, and wherein each device is associated with one of the sender queues.

12. The method of claim 10, wherein the destination logic includes a plurality of destination channel queues corresponding to the plurality of portions of destination logic, the method further comprising:
temporarily storing the packets to the sender queues according to the destination identifiers; and
retrieving the packets from the sender queues, wherein the unpacking is based on the packets retrieved from the sender queues synchronized with the source logic.

13. The method of claim 8, wherein a particular one of the channel definitions is indexed according to a particular one of the packets, wherein the particular channel definition includes an interface address to the destination logic, the method further comprising:
sending the particular packet directly to the destination logic via the interface address if the particular channel definition indicates a direct connection.

14. An article of manufacture comprising a non-transitory machine accessible storage medium including content that when accessed by a machine causes the machine to perform operations including:
generating packets to carry signal data from a plurality of portions of source logic for a destination logic cloning the source logic, the packets including identifiers identifying virtual channels mapping the plurality of portions of the source logic to a plurality of portions of the destination logic;
storing the packets into a queue of the signal data for a period;
distributing the packets from the queue to the portions of the destination logic according to the virtual channels identified; and
unpacking the signal data from the packets to update the portions of the destination logic for the destination logic to emulate the source logic with a delay for the period.

15. The article of manufacture of claim 14, wherein the source logic is driven by a plurality of clock domains and wherein each portion belongs to one of the domains.

16. The article of manufacture of claim 14, wherein the queue is in a switching logic coupled with the source logic via one or more interfaces, wherein the plurality of portions of source logic are associated with a plurality of source channel queues, and wherein storing the packets comprises:
temporarily storing each packet in one of the plurality of source channel queues; and
sending packets from at least one of the source channel queues to the switching logic via one of the interfaces.

17. The article of manufacture of claim 16, wherein the source logic is partitioned into one or more devices, and wherein each device includes one of the interfaces.

18. The article of manufacture of claim 16, further comprising:
arbitrating the packets from the at least one of the source channel queues into a sequence for sharing the one of the interfaces synchronized with the source logic.

19. The article of manufacture of claim 18, wherein the switching logic is driven by a switching clock domain, further comprising:
synchronizing with the switching clock domain for the sending of the packets via the interfaces.

20. The article of manufacture of claim 16, wherein the switching logic includes one or more receiver queues corresponding to the one or more interfaces to allow the packets to arrive concurrently among the interfaces, further comprising:
arbitrating the packets from the receiver queues in sequence into the queue synchronized with the source logic.

21. The article of manufacture of claim 14, wherein the switching logic includes a storage storing a plurality of channel definitions for the virtual channels indexed by the identifiers, wherein the distribution comprises:
retrieving the packets from the queue in sequence;
decoding the identifiers from the packets retrieved for the channel definitions.

22. The article of manufacture of claim 21, wherein the plurality of channel definitions include destination identifiers for the plurality of portions of the destination logic, further comprising:
updating the packets with the destination identifiers in place of the identifiers.

23. The article of manufacture of claim 21, wherein the plurality of channel definitions identify one or more sender queues separately coupled to the destination logic, further comprising:
temporarily storing each packet in one of the sender queues; and
sending the packets from the sender queues in parallel to the destination logic synchronized with the source logic.

24. The article of manufacture of claim 23, wherein the destination logic is partitioned into one or more devices, and wherein each device is associated with one of the sender queues.

25. The article of manufacture of claim 23, wherein the destination logic includes a plurality of destination channel queues corresponding to the plurality of portions of destination logic, further comprising:
   temporarily storing the packets to the sender queues according to the destination identifiers; and
   retrieving the packets from the sender queues, wherein the unpacking is based on the packets retrieved from the sender queues synchronized with the source logic.

26. The article of manufacture of claim 21, wherein a particular one of the channel definitions is indexed according to a particular one of the packets, wherein the particular channel definition includes an interface address to the destination logic, further comprising:
   sending the particular packet directly to the destination logic via the interface address if the particular channel definition indicates a direct connection.

27. A logic design testing comprising:
   packets to carry signal data from a plurality of portions of source logic for a destination logic cloning the source logic, the packets including identifiers identifying virtual channels mapping the plurality of portions of the source logic to a plurality of portions of the destination logic;
   a queue of the signal data to store the packets for a period;
   the portions of the destination logic receiving the distributed packets from the queue to according to the virtual channels identified; and
   the signal data from the packets unpacked to update the portions of the destination logic for the destination logic to emulate the source logic with a delay for the period.

* * * * *